(12) United States Patent
Shin

(10) Patent No.: US 7,447,034 B2
(45) Date of Patent: Nov. 4, 2008

(54) CHASSIS BASE ASSEMBLY AND FLAT PANEL DISPLAY DEVICE HAVING THE SAME

(75) Inventor: Dong-Hyok Shin, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/369,984

(22) Filed: Mar. 8, 2006

(65) Prior Publication Data

US 2006/0203143 A1 Sep. 14, 2006

(30) Foreign Application Priority Data

Mar. 9, 2005 (KR) .................. 10-2005-0019564

(51) Int. Cl.
*H05K 7/20* (2006.01)
(52) U.S. Cl. .............. 361/714; 361/704; 361/707; 361/709; 361/713; 345/905; 348/748; 349/161; 165/185
(58) Field of Classification Search ......... 361/681–682, 361/714, 704, 709–710, 719, 707, 713; 174/16.3; 345/905, 60; 349/161; 165/80.3, 104.33, 165/185; 313/46, 582; 348/748
See application file for complete search history.

(56) References Cited

U.S. PATENT DOCUMENTS

| | | | | |
|---|---|---|---|---|
| 6,304,451 B1 * | 10/2001 | Rife | ........................... | 361/704 |
| 6,657,620 B2 * | 12/2003 | Oishi et al. | ................ | 345/204 |
| 6,677,664 B2 * | 1/2004 | Inoue et al. | ................ | 257/668 |
| 6,735,084 B1 * | 5/2004 | Choi et al. | ................ | 361/704 |
| 6,744,186 B2 * | 6/2004 | Oishi et al. | ................ | 313/46 |
| 7,164,586 B2 * | 1/2007 | Lin | ........................... | 361/714 |
| 7,167,365 B2 * | 1/2007 | Fu et al. | ................ | 361/697 |
| 7,336,494 B2 * | 2/2008 | Nishimura et al. | ......... | 361/714 |
| 2004/0085737 A1 * | 5/2004 | Choi et al. | ................ | 361/719 |
| 2005/0013117 A1 | 1/2005 | Barsun et al. | | |
| 2005/0078446 A1 * | 4/2005 | Bae | ........................... | 361/687 |
| 2005/0212426 A1 * | 9/2005 | Ahn | ........................... | 313/582 |
| 2005/0243106 A1 * | 11/2005 | Bae et al. | ................ | 345/679 |
| 2005/0259401 A1 * | 11/2005 | Han et al. | ................ | 361/704 |
| 2006/0012963 A1 * | 1/2006 | Nishimura et al. | ......... | 361/714 |
| 2006/0077619 A1 * | 4/2006 | Kim et al. | ................ | 361/679 |
| 2006/0203445 A1 * | 9/2006 | Hsu et al. | ................ | 361/687 |

FOREIGN PATENT DOCUMENTS

| | | |
|---|---|---|
| JP | 10-262317 | 9/1998 |
| JP | 2000338904 A * | 12/2000 |

(Continued)

OTHER PUBLICATIONS

English translation of Japanese patent Hori et al. JP 10-262317 A, Sep. 1998.*

*Primary Examiner*—Jayprakash N Gandhi
*Assistant Examiner*—Robert J Hoffberg
(74) *Attorney, Agent, or Firm*—Lee & Morse, P.C.

(57) ABSTRACT

A chassis base assembly including a chassis base, a driving circuit unit located at a rear side of the chassis base, the driving circuit unit including a circuit element protruding from the driving circuit unit toward the chassis base, and a heat sink attached to the circuit element, and a flat panel display device having the same.

12 Claims, 4 Drawing Sheets

FOREIGN PATENT DOCUMENTS

| | | |
|---|---|---|
| JP | 2001-352022 | 12/2001 |
| JP | 2004207192 A * | 7/2004 |
| JP | 2004326028 A * | 11/2004 |
| JP | 2005017630 A * | 1/2005 |
| KR | 2003073422 A * | 9/2003 |
| KR | 2005051045 A * | 6/2005 |
| KR | 2005122960 A * | 12/2005 |

* cited by examiner

CHASSIS BASE ASSEMBLY AND FLAT PANEL DISPLAY DEVICE HAVING THE SAME

BACKGROUND OF THE INVENTION

1. Field of the Invention

The present invention relates to a chassis base assembly and a flat panel display device having the same. More particularly, the present invention relates to a chassis base assembly having a noise-reducing structure for connecting a chassis base and a driving circuit, which may reduce noise generation during the operation of a panel assembly, and a flat panel display device including the chassis base assembly.

2. Description of the Related Art

In general, flat panel display devices can be classified into light emitting types and light receiving types. Examples of light emitting type flat panel display devices include flat cathode ray tubes, plasma display panels, electroluminescent display devices, and light emitting diodes. Examples of light receiving type flat panel display devices include liquid crystal display devices.

The plasma display panel is a flat panel display device in which a plurality of discharge electrodes are formed on a plurality of substrates, a discharge gas is filled into a hermetically sealed discharge space between the substrates, power is applied to the discharge electrodes to excite a fluorescent layer with ultraviolet light generated in the discharge space, and an image is formed by light emitted from the fluorescent substance. The fluorescent layer may be, e.g., a colored phosphor.

A conventional plasma display device may include a front panel, a panel assembly including a rear panel, a chassis base coupled to the panel assembly, a driving circuit unit coupled to the rear of the chassis base, and circuit elements mounted on the driving circuit unit.

The conventional plasma display device generates a lot of heat from the circuit elements during operation. When this heat is not properly dissipated, especially from ICs such as scan ICs, hybrid ICs or FETs, erroneous operation may result.

To prevent erroneous operation, the conventional plasma display device may dissipate heat by way of a heat sink attached to one side of the circuit elements. In addition, to reduce or eliminate noise generated by the driving circuit unit, a noise plate may be coupled to the rear side of the driving circuit unit.

Despite the efforts described above to reduce heat and noise, there remains a need for enhanced heat dissipation, noise reduction and vibration reduction.

SUMMARY OF THE INVENTION

The present invention is therefore directed to a chassis base assembly and a flat panel display device having the same, which substantially overcome one or more of the problems due to the limitations and disadvantages of the related art.

It is therefore a feature of an embodiment of the present invention to provide a chassis base assembly having a structure that enhances heat dissipation, in which a circuit element is located between a chassis base and a driving circuit unit, and a flat panel display device having the chassis base assembly.

It is therefore another feature of an embodiment of the present invention to provide a chassis base assembly having a structure that reduces noise, in which a noise absorbing and/or vibration reducing member is provided between a chassis base and a driving circuit unit, and a flat panel display device having the chassis base assembly.

At least one of the above and other features and advantages of the present invention may be realized by providing a chassis base assembly including a chassis base, a driving circuit unit located at a rear side of the chassis base, the driving circuit unit including a circuit element protruding from the driving circuit unit toward the chassis base, and a heat sink attached to the circuit element.

The heat sink may contact the chassis base. The heat sink may contact the driving circuit unit and the chassis base. The chassis base assembly may further include a sheet provided between a surface of the chassis base and the heat sink. The sheet may be a noise absorbing member. The sheet may be a vibration reducing member. The sheet may have a dual layer structure including a noise absorbing member and a vibration reducing member. The heat sink may contact the sheet. The heat sink may contact the sheet and the chassis base. The heat sink may be spaced apart from the chassis base.

At least one of the above and other features and advantages of the present invention may be realized by providing a flat panel display device including an image-generating panel assembly having a front panel and a rear panel coupled together, a chassis base assembly including, a chassis base located at a rear side of the panel assembly, a driving circuit unit located at a rear side of the chassis base, a circuit element protruding from the driving circuit unit toward the chassis base, and a heat sink attached to the circuit element, and a case receiving the panel assembly and the chassis base assembly.

The heat sink may contact the chassis base. The heat sink may contact the driving circuit unit and the chassis base. The flat panel display device may further include a sheet on a rear surface of the chassis base facing the driving circuit unit, the sheet including at least one of a noise absorbing member and a vibration reducing member. The heat sink may contact the sheet. The heat sink may contact the sheet and the chassis base. The heat sink may be spaced apart from the chassis base.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
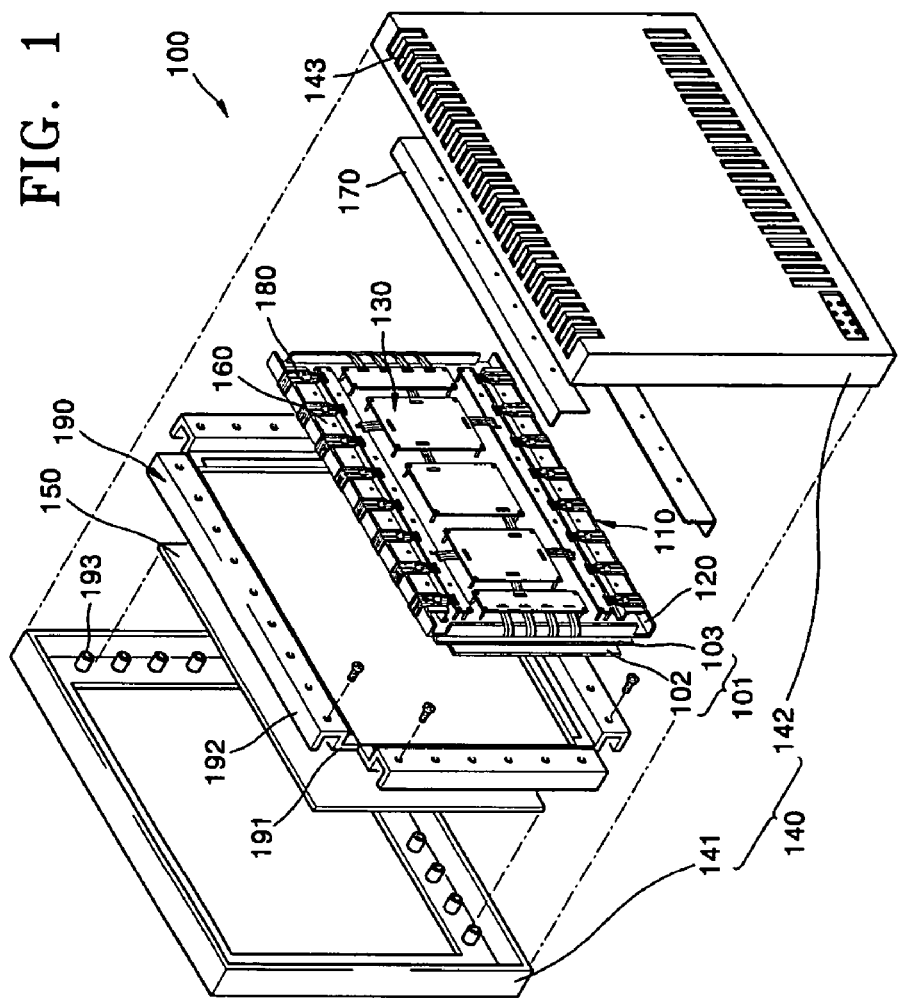
FIG. 1 illustrates an exploded perspective view of a plasma display device according to an embodiment of the present invention.

Korean Patent Application No. 10-2005-0019564, filed on Mar. 9, 2005, in the Korean Intellectual Property Office, and entitled: "Chassis Base Assembly and Flat Panel Display Device Having the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A chassis base assembly according to the present invention, and a flat panel display device using the same, may provide enhanced performance in a number of ways. First, a heat-generating circuit element may be located between a chassis base and a driving circuit unit, with a heat sink attached to the circuit element. Thus, heat generated from the circuit element may be spread among the heat sink and the chassis base to enhance the rate at which heat is dissipated.

Second, a sheet, such as a noise absorbing and/or vibration reducing member, may be attached to the outer surface of the chassis base, so that noise or vibrations generated during operation may be reduced or prevented.

Third, for a panel assembly that generates large amounts heat, a sheet disposed on the outer surface of the chassis base, such as a noise absorbing and/or a vibration reducing member, may serve to block heat in the chassis base from being transferred to the driving circuit unit, thereby reducing or eliminating the likelihood of the driving circuit unit being overheated.

Fourth, the chassis base may function as a soundproof wall, and therefore an additional noise plate may not be needed on the driving circuit unit.

FIG. 1 illustrates an exploded perspective view of a plasma display device according to an embodiment of the present invention. Referring to FIG. 1, a plasma display panel 100 may include a panel assembly 101, a chassis base assembly 110 coupled to the rear side of the panel assembly 101, a filter assembly 150 located at the front side of the panel assembly 101, and a case 140 for receiving the panel assembly 101, the chassis base assembly 110 and the filter assembly 150.

The panel assembly 101 may include a front panel 102 and a rear panel 103 facing each other. Glass frit (not shown) may be applied to edge portions of opposite inner surfaces of the front panel 101 and the rear panel 102, and the front panel 101 and the rear panel 102 may be sealed together to form a discharge space therebetween.

The chassis base assembly 110 may be located at the rear side of the panel assembly 101. The chassis base assembly 110 may include a chassis base 120, one or more driving circuit units 130 located at the rear side of the chassis base 120, and flexible printed cables 180 that electrically connect the panel assembly 101 to the driving circuit units 130. A plurality of circuit elements may be included in the driving circuit unit 130, and the flexible printed cables 180 may be connected between display electrodes (not shown) and the driving circuit units 130 to transfer electrical signals.

The chassis base 120 may be formed from a plate, e.g., a metallic plate having a high heat dissipation capability. In order to reinforce its rigidity, one or more strip-like chassis reinforcement members 160 may be attached, e.g., on upper and lower parts of the rear side of the chassis base 120. In addition, a cover plate 170 may be installed on upper and lower sides of the chassis base 120. The cover plate 170 may be separated from the chassis base 120 by a predetermined distance and cover the upper and lower sides of the chassis base 120.

The filter assembly 150 may be located at the front side of the panel assembly 101 and may serve to block electromagnetic radiation, infrared light, etc., generated by the panel assembly 101 during operation, and may also reduce reflections caused by external light.

A filter holder 190 may be located at the rear side of the filter assembly 150. The filter holder 190 may include a clamping portion 191, which presses the filter assembly 150 against a front cover 141, and a fixing portion 192, which is bent backward from the clamping portion 191. In addition, a filter placement portion 193 may be provided at the rear side of the front cover 141. The filter placement portion 193 may be disposed to face the fixing portion 192 and may fix the filter assembly 150 to the front cabinet 141 using, e.g., screws.

The case 140 may include the front cover 141 located at the front side of the filter assembly 150 and a back cover 142 located at the rear side of the chassis base assembly 110. A plurality of vent holes 143 may be formed in upper and lower parts of the cover back 142.

Figure 2:
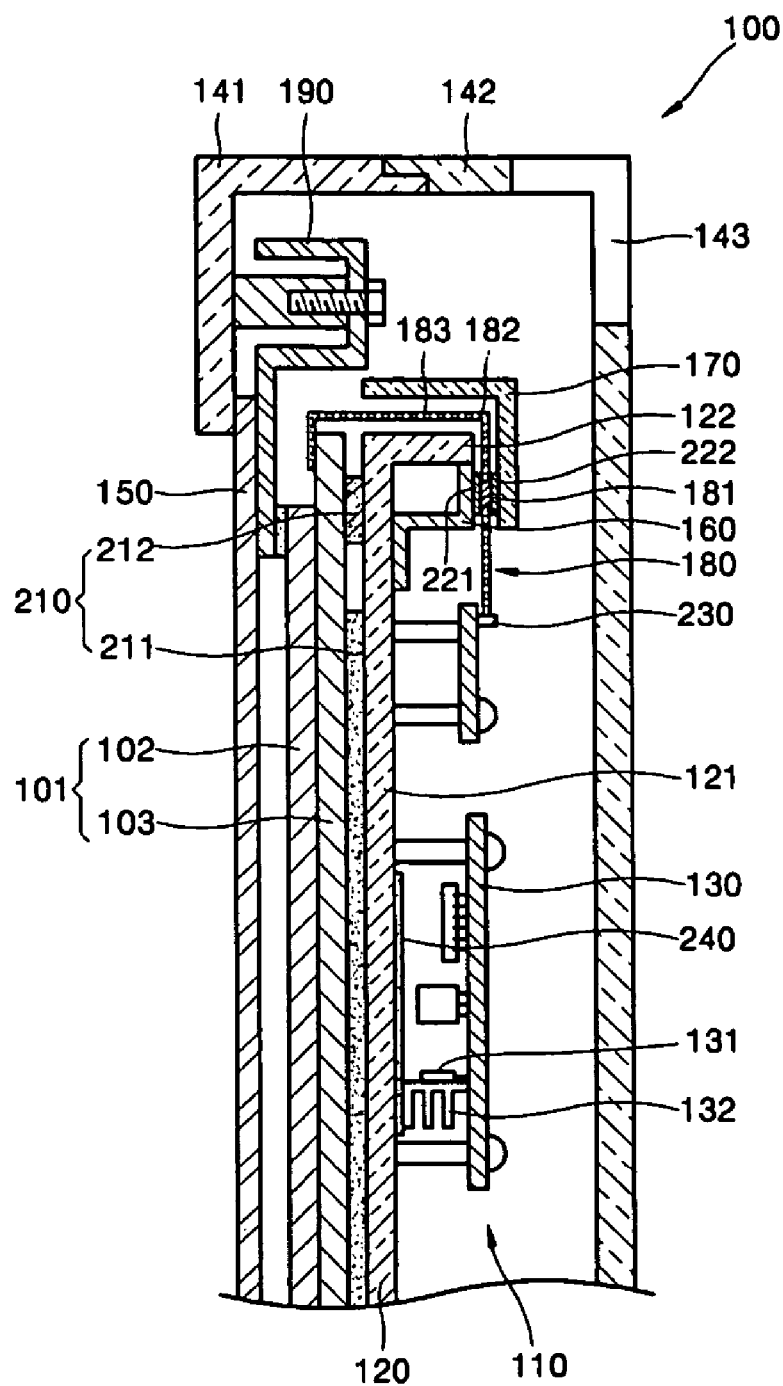
FIG. 2 illustrates a sectional view of the plasma display device of FIG. 1 in an assembled state.

FIG. 2 illustrates a sectional view of the plasma display device of FIG. 1 in an assembled state. Referring to FIG. 2, a circuit element 131 of the driving circuit unit 130 may protrude from the driving circuit unit 130 toward the chassis base 120, so that it is located between the chassis base 120 and the bulk of the driving circuit unit 130. A heat sink 132 may be placed in thermal contact with the circuit element 131. These features will be discussed in greater detail below.

The chassis base 120 may be coupled to the rear side of the panel assembly 101 by, e.g., an adhesive 210. The adhesive 210 may include an adhesive heat dissipation sheet 211, e.g., a silicone sheet, which may be provided between the rear panel 103 and a flat plate portion 121 of the chassis base 120. The adhesive 210 may also include double sided tape 212 that is attached along edges of the heat dissipation sheet 211.

The chassis base 120 may include the flat plate portion 121 arranged in parallel to the panel assembly 101. The chassis base 120 may also include a bent portion 122, which may be formed by bending upper and/or lower portions of the flat plate portion 121 in a direction opposite to the panel assembly 101.

The flexible printed cable 180 may be located between the flat plate portion 121 of the chassis base 120 and the cover plate 170. The flexible printed cable 180 may include one or more driving ICs 181, wire 182 coupled to the driving IC 181, and a flexible film 183 that covers the wire 182. One end of the flexible printed cable 180 may be electrically connected to the electrodes of the panel assembly 101, and the other end may be connected via a connecter 230 to the driving circuit unit 130.

The driving IC 181 may be located between the chassis reinforcement member 160 and the cover plate 170. Thermal grease 221 may be disposed between the chassis reinforcement member 160 and the driving IC 181, and a thermal conductive sheet 222 may be located between the driving IC 181 and the cover plate 170.

As noted above, the circuit element 131 may protrude from the driving circuit unit 130 so that it is located between the chassis base 120 and the bulk of the driving circuit unit 130. The circuit element 131 may be a part of the driving circuit unit 130 and may be located toward the rear side of the chassis base 120. The circuit element 131 may generate significant amounts of heat and may include, e.g., FETs, ICs, etc. The heat sink 132 may be attached to one side of the circuit element 131.

The heat sink 132 may be disposed apart from the chassis base 120. Thus, if large amounts of heat generated by the panel assembly 101 during operation are transferred to the chassis base 120, the heat transferred to the chassis base 120 may be prevented from passing through the chassis base 120 and the heat sink 132 to affect the circuit element 131. That is, the circuit element 131 may be protected from external heat conducted through the chassis base 120

Figure 3:
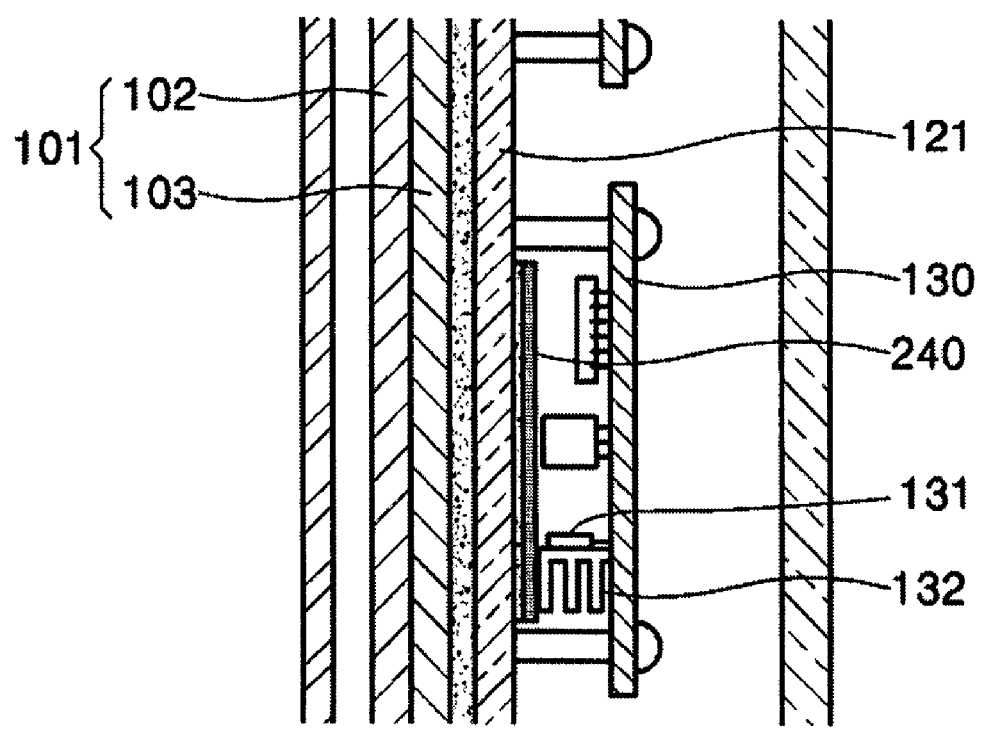
FIG. 3 illustrates an enlarged partial sectional view of another embodiment of the plasma display device of FIG. 1.

In particular, a sheet 240 may be included to absorb noise and/or vibration. A single-layer sheet 240 may be employed to absorb noise and/or reduce vibration, or a multi-layer sheet 240 may be employed, as illustrated in FIG. 3, which may be better suited to both absorb noise and reduce vibration. The sheet 240 may be attached to the chassis base 120. The sheet 240 may be attached to the outer, or rearward, surface of the chassis base 120, such that the outer surface of one end of the heat sink 132 contacts the surface of the sheet 240. That is, the sheet 240 may be interposed between the chassis base 120 and the heat sink 132. The driving circuit unit 130 may be mounted to the chassis base 120 such that the heat sink 132 is clamped against the driving circuit unit 130 and the sheet 240.

In the above-described structure, heat generated from the circuit element 131 may be dissipated through the heat sink 132. However, heat generated elsewhere in the display and transferred to the chassis base 120 may be prevented from being transferred to the circuit element 131. That is, heat transfer from the chassis base 120 may be blocked by the sheet 240. At the same time, as the sheet 240 is attached to the outer surface of the chassis base 120, noise and/or vibration may be reduced or prevented.

Figure 4:
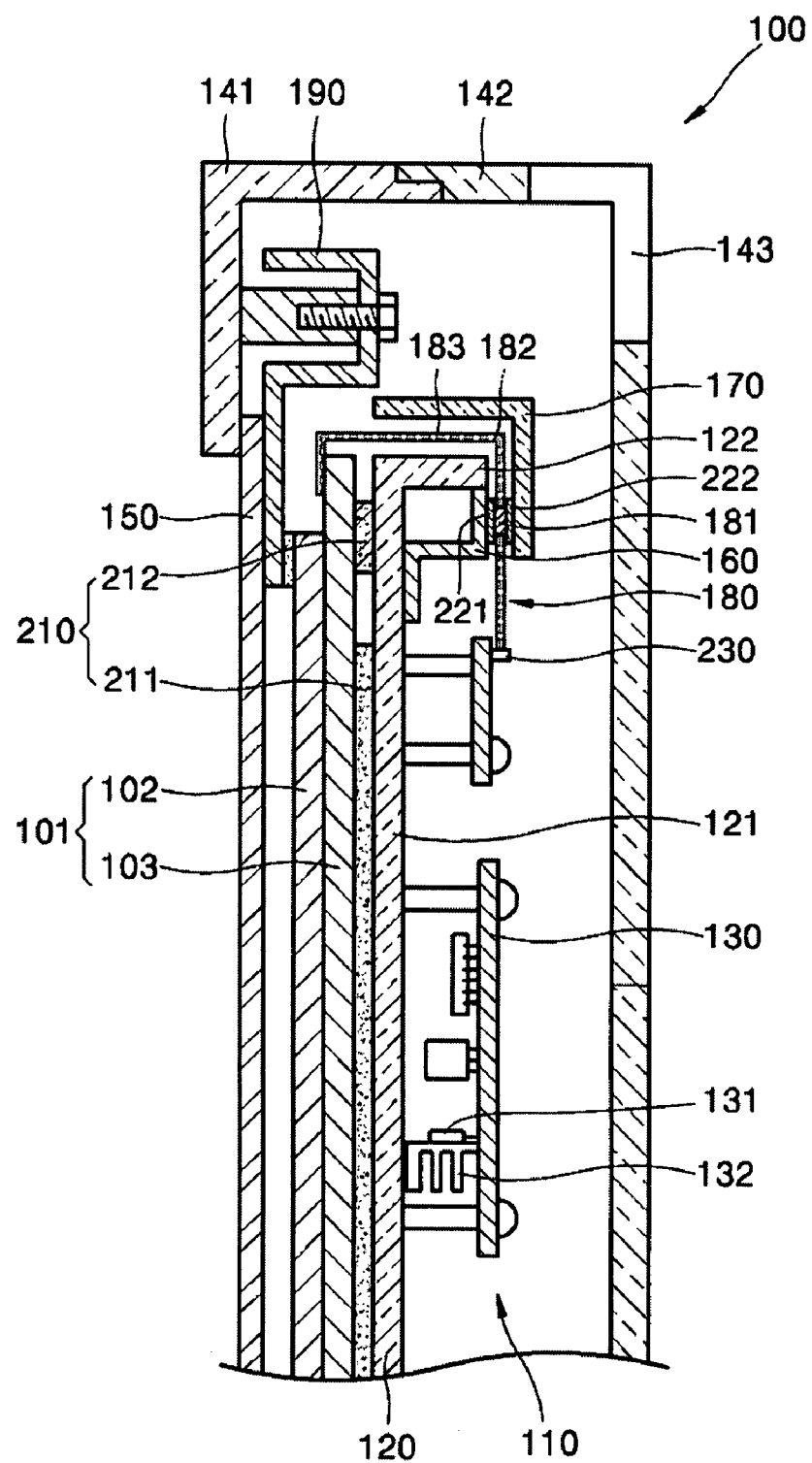
FIG. 4 illustrates a sectional view of still another embodiment of the plasma display device of FIG. 1.

In another implementation, illustrated in FIG. 4, a portion of the heat sink 132 may be placed in contact with the chassis base 120 to dissipate the heat generated by the circuit element 131 through the chassis base 120 during operation. Thus, for example, in situations where the chassis base 120 is not excessively heated by other components of the display, heat generated by the circuit element 131 may be dissipated through the heat sink 132 and the chassis base 120, enhancing the ability to dissipate heat. The driving circuit unit 130 may be mounted to the chassis base 120 such that the heat sink 132 is clamped between the driving circuit unit 130 and the chassis base 120, with the heat sink 132 clamped against the driving circuit unit 130 and the chassis base 120.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A chassis base assembly, comprising:
   a chassis base;
   a driving circuit unit located at a rear side of the chassis base, the driving circuit unit including a circuit element protruding from the driving circuit unit toward the chassis base;
   a heat sink attached to the circuit element, the heat sink having a major surface oriented normal to the chassis base and a plurality of radiating members extending normal to the major surface; and
   a thermally insulating sheet provided between a surface of the chassis base and a surface of the heat sink, the insulating sheet contacting the surface of the chassis base and the surface of the heat sink.

2. The chassis base assembly as claimed in claim 1, wherein the sheet is a noise absorbing member.

3. The chassis base assembly as claimed in claim 1, wherein the sheet is a vibration reducing member.

4. The chassis base assembly as claimed in claim 1, wherein the sheet has a dual layer structure including a noise absorbing member and a vibration reducing member.

5. The chassis base assembly as claimed in claim 1, wherein the heat sink is clamped against the sheet.

6. The chassis base assembly as claimed in claim 5, wherein the heat sink is clamped against the sheet and the chassis base.

7. The chassis base assembly as claimed in claim 1, wherein the heat sink is spaced apart from the chassis base.

8. A flat panel display device comprising:
   an image-generating panel assembly having a front panel and a rear panel coupled together;
   a chassis base assembly including:
      a chassis base located at a rear side of the panel assembly;
      a driving circuit unit located at a rear side of the chassis base;
      a circuit element protruding from the driving circuit unit toward the chassis base;
      a heat sink attached to the circuit element, the heat sink having a major surface oriented normal to the chassis base and a plurality of radiating members extending normal to the major surface; and
      a thermally insulating sheet on a rear surface of the chassis base facing the driving circuit unit, the insulating sheet contacting the surface of the chassis base and a surface of the heat sink; and
   a case receiving the panel assembly and the chassis base assembly.

9. The flat panel display device as claimed in claim 8, wherein the sheet includes at least one of a noise absorbing member and a vibration reducing member.

10. The flat panel display device as claimed in claim 8, wherein the heat sink is clamped against the sheet.

11. The flat panel display device as claimed in claim 10, wherein the heat sink is clamped against the sheet and the chassis base.

12. The flat panel display device as claimed in claim 8, wherein the heat sink is spaced apart from the chassis base.

* * * * *